(12) United States Patent
Chen et al.

(10) Patent No.: US 7,619,224 B2
(45) Date of Patent: Nov. 17, 2009

(54) GENERATION, ACCELERATION, FOCUSING AND COLLECTION OF A HIGH-BRIGHTNESS, SPACE-CHARGE-DOMINATED CIRCULAR CHARGED-PARTICLE BEAM

(75) Inventors: Chiping Chen, Needham, MA (US); Thomas M. Bemis, Arlington, MA (US); Ronak J. Bhatt, Cypress, TX (US); Jing Zhou, Woburn, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 110 days.

(21) Appl. No.: 11/940,495

(22) Filed: Nov. 15, 2007

(65) Prior Publication Data
US 2008/0173827 A1 Jul. 24, 2008

Related U.S. Application Data

(60) Provisional application No. 60/865,895, filed on Nov. 15, 2006.

(51) Int. Cl.
*H01J 49/10* (2006.01)
*H01J 1/50* (2006.01)

(52) U.S. Cl. ............... 250/423 R; 250/424; 250/423 F; 250/396 R; 250/396 ML; 250/492.21; 315/111.81; 315/111.41

(58) Field of Classification Search ............. 250/423 R, 250/423 F, 424, 396 R, 396 ML, 492.21; 315/111.81, 111.41
See application file for complete search history.

(56) References Cited

U.S. PATENT DOCUMENTS 5,550,432 A    8/1996  Barker
6,943,507 B2 * 9/2005  Winkler et al. ............. 315/382
7,381,967 B2 * 6/2008  Bhatt et al. ........... 250/396 ML
2008/0067408 A1 * 3/2008  Winkler ................... 250/423 F

OTHER PUBLICATIONS

Bhatt et al., "Theory and simulation of nonrelativistic elliptic-beam formation with one-dimensional Child-Langmuir flow characteristics" Physical Review Special Topics-Accelerators and Beams, 2005 The American Physical Society, pp. 014201-1-014201-5.
Pierce et al., "Rectilinear Electron Flow in Beams" Journal of Applied Physics, Dec. 2005, XP-002354651, pp. 548-554.
Bhatt et al., "Three-Dimensional Theory and Simulation of Nonrelativistic Elliptic Electron and Ion Beam Generation" IEEE Transactions on Plasma Science, vol. 34, No. 2, Apr. 2006, pp. 187-193.

* cited by examiner

*Primary Examiner*—Nikita Wells
(74) *Attorney, Agent, or Firm*—Gauthier & Connors LLP

(57) ABSTRACT

A high-brightness, space-charge-dominated circular charged-particle beam system includes a flat circular emitter that emits charge particles to form a space-charge-dominated circular charged-particle beam. The space-charge-dominated circular charged-particle beam is emitted from the flat circular emitter with a uniform density and having a current emission being space-charge-limited, obeying the Child-Langmuir law. A diode includes at least one electrode at the flat circular emitter and at least one additional electrode that accelerates the charged particles. A beam tunnel is coupled electrically to at least one of the additional electrodes. An applied axisymmetric magnetic field focuses the space-charge-dominated circular charged-particle beam. A depressed collector collects the space-charge-dominated circular charged-particle beam.

18 Claims, 6 Drawing Sheets

GENERATION, ACCELERATION, FOCUSING AND COLLECTION OF A HIGH-BRIGHTNESS, SPACE-CHARGE-DOMINATED CIRCULAR CHARGED-PARTICLE BEAM

PRIORITY INFORMATION

This application claims priority from provisional application Ser. No. 60/865,895 filed Nov. 15, 2006, which is incorporated herein by reference in its entirety.

BACKGROUND OF THE INVENTION

The invention relates to the field of charged-particle beam systems, and in particular to the design and implementation of high-brightness, space-charge-dominated charged-particle beams, including beam generation, acceleration, focusing, and collection.

High-brightness, space-charge-dominated charged-particle beams are of great interest because of their applications in particle accelerators, medical applications, vacuum electron devices, and material processing such as ion implantation. When the beam brightness increases, the beam becomes space-charge-dominated. In the space-charge-dominated regime, the beam equilibrium is characterized by a beam core with a transversely uniform density distribution and a sharp edge where the beam density falls rapidly to zero in a few Debye lengths.

For particle accelerators, high-brightness, space-charge-dominated charged-particle beams provide high beam intensities. For medical accelerators, they provide high radiation dosage. For vacuum electron devices, they permit high-efficiency, low noise operation with depressed collectors. For ion implantation, they improve deposition uniformity and speed.

However, there are significant theoretical, design and experimental challenges in the generation, acceleration, focusing, and collection of high-brightness charged-particle beams. The traditional approach to charged-particle dynamics problems involves extensive numerical optimization over the space of initial and boundary conditions in order to obtain desired charged-particle trajectories. The traditional approach is numerically cumbersome and will not obtain a global-optimum solution. As a result, beam systems designed using these approaches will result in a degradation of beam brightness, increased noise, particle loss, and reduced efficiency.

An essential component of charged-particle beam systems is the beam generation and acceleration diode, consisting of a charged-particle emitter and an electrostatic gap across which one or more electrostatic potential differences are maintained. The potential differences accelerate the emitted charged particles, forming a beam which exits the diode through an aperture and then enters a beam transport tunnel. Conventionally Pierce type diodes with or without a grid are employed to produce to the Child-Langmuir emission. Compression is often used in Pierce type diodes in order to generate the desired beam radius. Scrapers are also often used to chop off the nonuniform beam edges. The grid, compression and scrapers introduce a mismatch into the beam systems and degrade beam brightness.

A second essential component of charged-particle beam systems is the transition from the diode to the beam focusing tunnel. In the beam focusing tunnel, combinations of magnetic and electrostatic fields are used to confine a beam such that it maintains laminar flow. If the proper focusing field structure is not applied, the beam can undergo envelope oscillations which contribute to beam brightness degradation and particle loss. While the rigid-rotor equilibrium is well-known for a uniform solenoidal focusing field, a good matching of a circular beam from a Pierce type diode into the rigid-rotor equilibrium has not been reported until this invention.

A third essential component of many charged-particle beam systems is the depressed collector placed at the end of the beam transport tunnel to collect the remaining energy in the beam. A well-designed depressed collector minimizes the waste heat generated by the impacting beam while maximizing the electrical energy recovered from said beam. Modern high-efficiency multiple-stage depressed collectors (complicated structures with multiple electrodes held at different potentials) can obtain collection efficiencies approaching 90%.

SUMMARY OF THE INVENTION

According to one aspect of the invention, there is provided a high-brightness, space-charge-dominated circular charged-particle beam system. The space-charge-dominated circular charged-particle beam system includes a flat circular emitter that emits charge particles to form a space-charge-dominated circular charged-particle beam. The space-charge-dominated circular charged-particle beam is emitted from the flat circular emitter with a uniform density and having a current emission being space-charge-limited, obeying the Child-Langmuir law. A diode includes at least one electrode at the flat circular emitter and at least one additional electrode that accelerates the charged particles. A beam tunnel is coupled electrically to at least one of the additional electrodes. An applied axisymmetric magnetic field focuses the space-charge-dominated circular charged-particle beam. A depressed collector collects the space-charge-dominated circular charged-particle beam.

According to one aspect of the invention, there is provided a method of forming a high-brightness, space-charge-dominated circular charged-particle beam system. The method includes forming a flat circular emitter that emits charge particles to form a space-charge-dominated circular charged-particle beam. The space-charge-dominated circular charged-particle beam is emitted from the flat circular emitter with a uniform density and having a current emission being space-charge-limited, obeying the Child-Langmuir law. The method also includes forming a diode includes at least one electrode at the flat circular emitter and at least one additional electrode that accelerates the charged particles. Moreover, the method includes forming a beam tunnel being coupled electrically to at least one of the additional electrodes. An applied axisymmetric magnetic field is formed to focus the space-charge-dominated circular charged-particle beam. Furthermore, the method includes forming a depressed collector that collects the space-charge-dominated circular charged-particle beam.

DETAILED DESCRIPTION OF THE INVENTION

Figure 1:
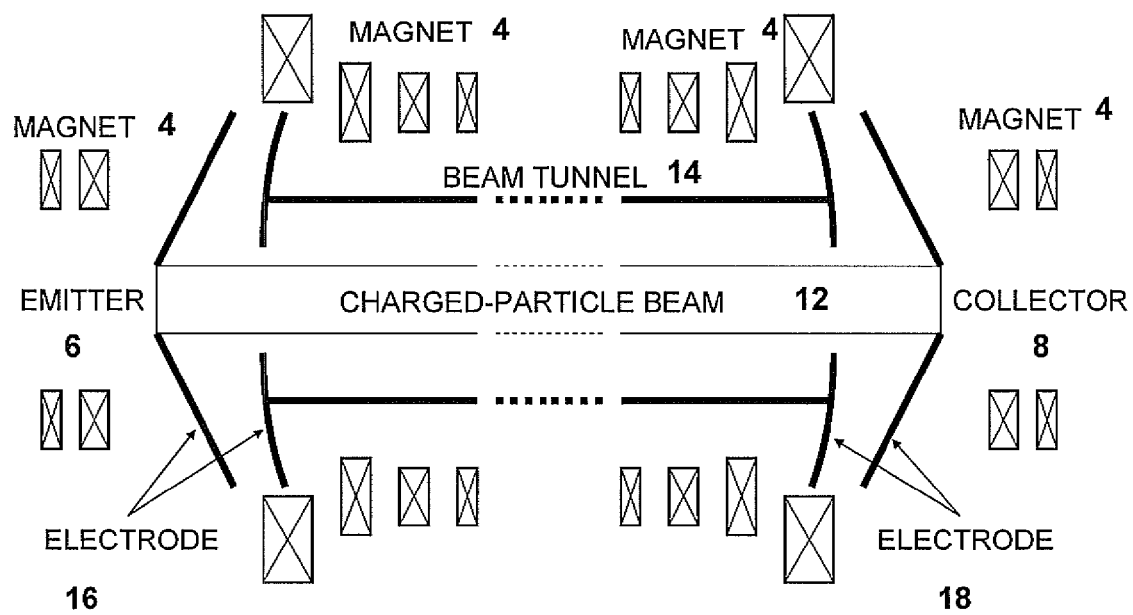
FIG. 1 is a schematic diagram illustrating a cross sectional view of a high-brightness circular charged-particle beam system.

The invention provides a technique for the generation, acceleration, focusing, and collection of a high-brightness, space-charge-dominated circular charged-particle beam. The charge particle includes electron, positron, proton, antiproton, or ion. As illustrated in a cross sectional view shown in FIG. 1, the beam system 2 includes a flat circular emitter 6 which emits a charged-particle beam 12. The beam 12 also includes a beam generation diode having one pair of electrodes 16 which accelerates the charged-particles, and a beam-collection diode having one pair of electrodes 18 which decelerates the charged particles. Both the beam-generation and beam-collection diodes may have additional electrodes to accelerate or decelerate the beam. A beam tunnel 14 is electrically connected to the two pairs of electrodes 16 and 18. An applied axisymmetric magnetic field is produced using the magnets 4 for charged-particle beam focusing. The emitter 6 includes a flat, circular disk. The circular charged-particle beam 12 is emitted from the emitter 6 with a uniform density. The current emission is space-charge-limited, obeying the Child-Langmuir law. The circular charged-particle beam 12 is collected at the collector 8.

The electrodes 12 and applied axisymmetric magnetic field are designed to preserve the beam cross section in the accelerating section. The technique for designing the required electrodes and applied axisymmetric magnetic field is described as follows.

Figure 2:
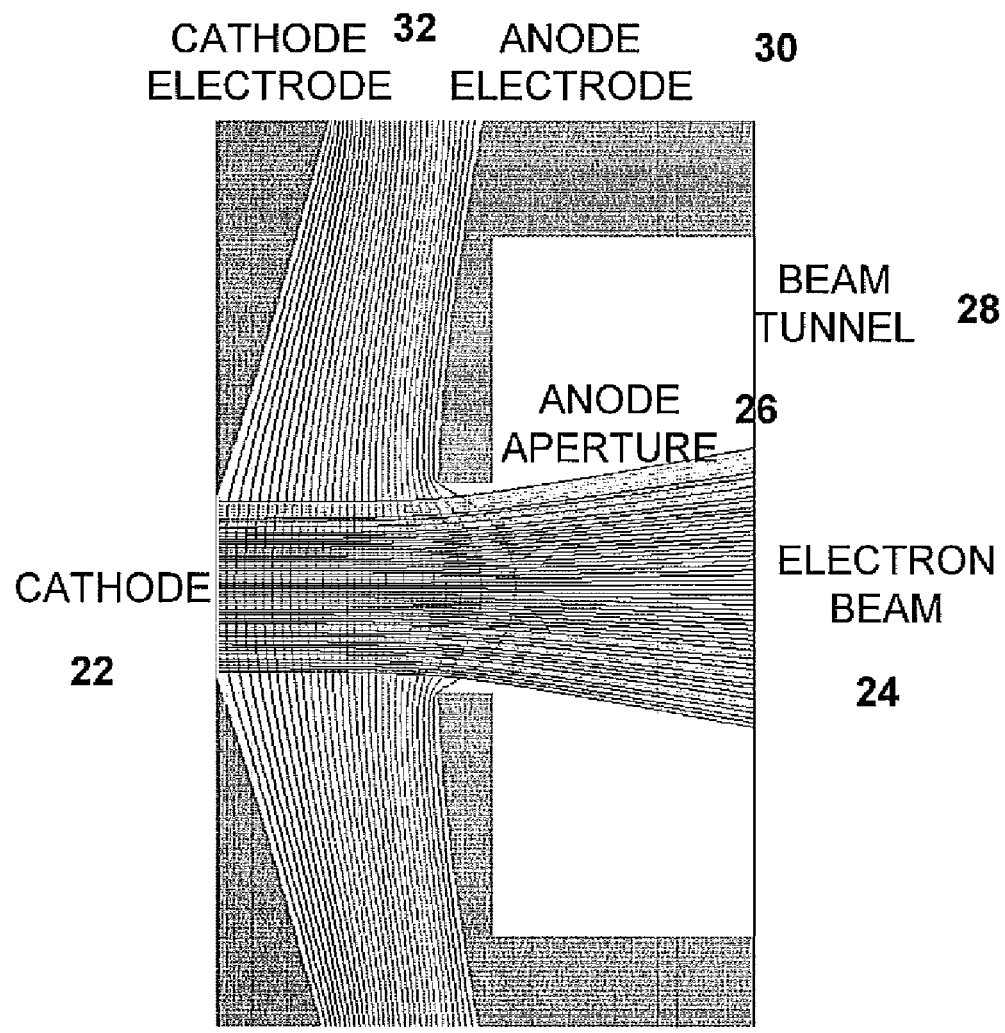
FIG. 2 is an Omnitrak simulation illustrating the dynamics of an electron beam emitted from a flat circular cathode.

The beam dynamics is modeled with an OMNITRAK simulation with no applied magnetic field. This provides the electric field database which is used to compute iteratively the applied magnetic field required to preserve the cross section of the charged-particle beam in the accelerating section. As an illustrative example, FIG. 2 shows the results of the OMNITRAK simulation for a circular electron beam 24 which is emitted from an emitter 22 having a cathode with a radius of 1.52 mm, a current of 0.11 ampere, a cathode-to-anode distance of 4.11 mm at radius r=1.52 mm. The diode voltage is 2300 V. In this illustrative example, the electrodes 30, 32 at the cathode and the anode are equipotential surfaces which are analytically computed to yield a Child-Langmuir flow in the absence of the circular anode aperture 26. A circular aperture 26 at the anode is chosen, and it has a radius of 1.8 mm. A larger circular beam tunnel 28 with a radius of 6.0 mm is connected to the anode. The total length of the system is 10 mm.

As a second step, an estimate of the required applied magnetic field is obtained by balancing all of the radial forces on the electrons on a line whose radius corresponds to the root-mean-square (rms) radius of the emitter (i.e., at radius of 1.075 mm). The line starts at the cathode disk and continues through the anode aperture.

Because the radial forces are balanced on this radius, the radial velocities of the electrons will remain to be zero, upon successive iterations. If the radial velocity and acceleration are held at zero for all values of z, there is no radial velocity. The beam cross section is preserved as it is transported through the aperture and into the beam tunnel. The resulting beam has a variable rotational velocity, providing a magnetic confinement force which precisely balances the centripetal and space charge repulsion forces for all values of z at r=1.075 mm.

For a thin charge-particle beam, an expression for the required magnetic field is derived to achieve the radial force balance at any radius in the beam core. The magnetic vector potential for an applied axisymmetric magnetic field is in the azimuthal direction. An applied axisymmetric magnetic field is expressed in terms of the vector potential in a cylindrical coordinate system as $$B = \hat{e}_z \frac{1}{r} \frac{\partial}{\partial r}(rA_\theta) - \hat{e}_r \frac{\partial A_\theta}{\partial z}. \tag{1}$$

In the thin-beam approximation, $$B = B_z(0, z)\hat{e}_z - \frac{1}{2}\frac{\partial B_z(0, z)}{\partial z}r\hat{e}_r. \tag{2}$$

Inspection of Eq. (1) and (2) gives $$A_\theta(r, z) = \frac{r}{2}B_z(0, z). \tag{3}$$

The conservation of canonical angular momentum yields the expression for the azimuthal velocity, $$\upsilon_\theta(r, z) = -\frac{q}{2m}[B_z(0, z) - B_z(0, 0)]r, \tag{4}$$

where use has been made of $\upsilon_\theta(r,0)=0$ at the emitter, and q and m are the particle charge and rest mass, respectively. The radial force balance equation is $$\frac{qE_r(r, z)}{m} = -\frac{\upsilon_\theta^2(r, z)}{r} - \frac{q}{m}\upsilon_\theta(r, z)B_z(r, z). \tag{5}$$

Substituting Eq. (4) into Eq. (5) yields the expression for the required applied magnetic field on the beam axis, i.e., $$\frac{qE_r(r, z)}{m} = \frac{q^2 r}{4m^2}B_z^2(0, z), \tag{6}$$

where use has been made of the approximation $B_z(r,z)=B_z(0,z)$ and the boundary condition $B_z(0,0)=0$. Equation (6) produces a relationship between $E_r/r$ and $B_z(0,z)$. It should be emphasized that for a thin beam, the function $E_r/r$ is only a function of z, which is evaluated from the electric field database from OMNITRAK simulations. From Eq. (2), the magnetic field database is expanded to produce a three dimensional magnetic field database on a uniform rectangular grid for OMNITRAK simulations.

By iterating the second step described above, better estimates of the required magnetic field are obtained. Typically, results converge after two or three iterations.

Figure 3:
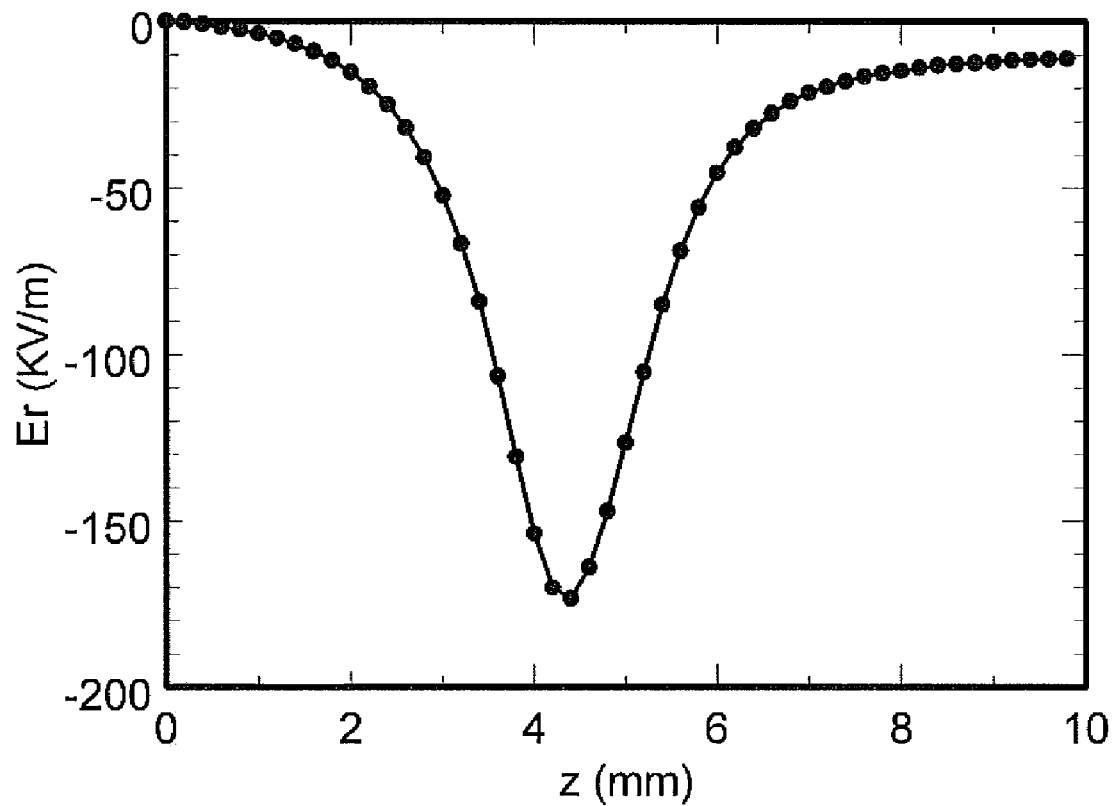
FIG. 3 is a graph illustrating $E_r$ versus z from OMNITRAK simulations after two iterations.
Figure 4:
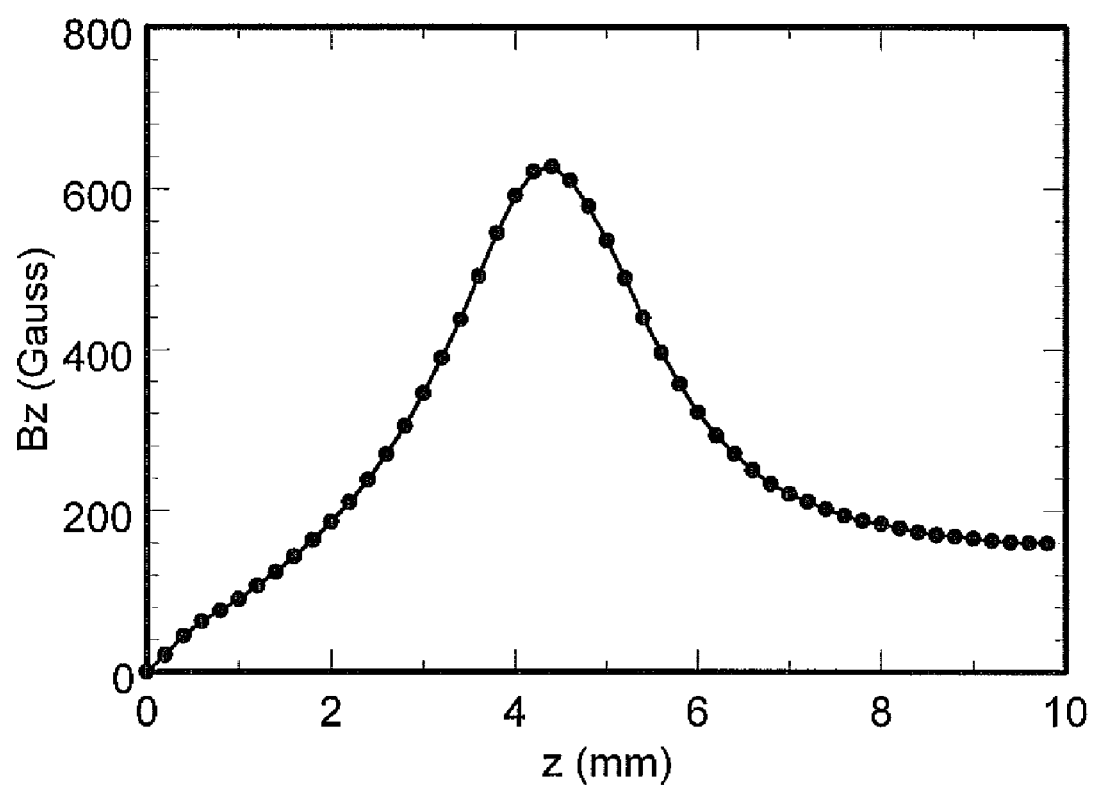
FIG. 4 is a graph illustrating $B_z(0,z)$ versus z from OMNITRAK simulations after two iterations

FIGS. 3 and 4 show, respectively, plots of $E_r$ versus z at r=1.0 mm and $B_z(0,z)$ versus z from the OMNITRAK simulations after two iterations. In FIG. 3, the radial field vanishes at the emitter (i.e., at z=0). The effect of the aperture is most pronounced at z=4.2 mm. The radial electric field approaches to a small, constant value as the beam propagates further inside the beam tunnel. In FIG. 4, the axial applied magnetic field is computed using the results in FIG. 3 and Eq. (6). The axial magnetic field at the emitter vanishes. It increases to 640 G at the aperture, and then falls to about 160 G well inside the beam tunnel. In the simulation, Eq. (6) is exactly satisfied for all the electrons on the rms beam radius, and approximately satisfied for the electrons not at the rms beam radius. The difference in the electric and applied magnetic forces in Eq. (6) results in less than 2% deviations of the electron radii from their initial values.

Figure 5:
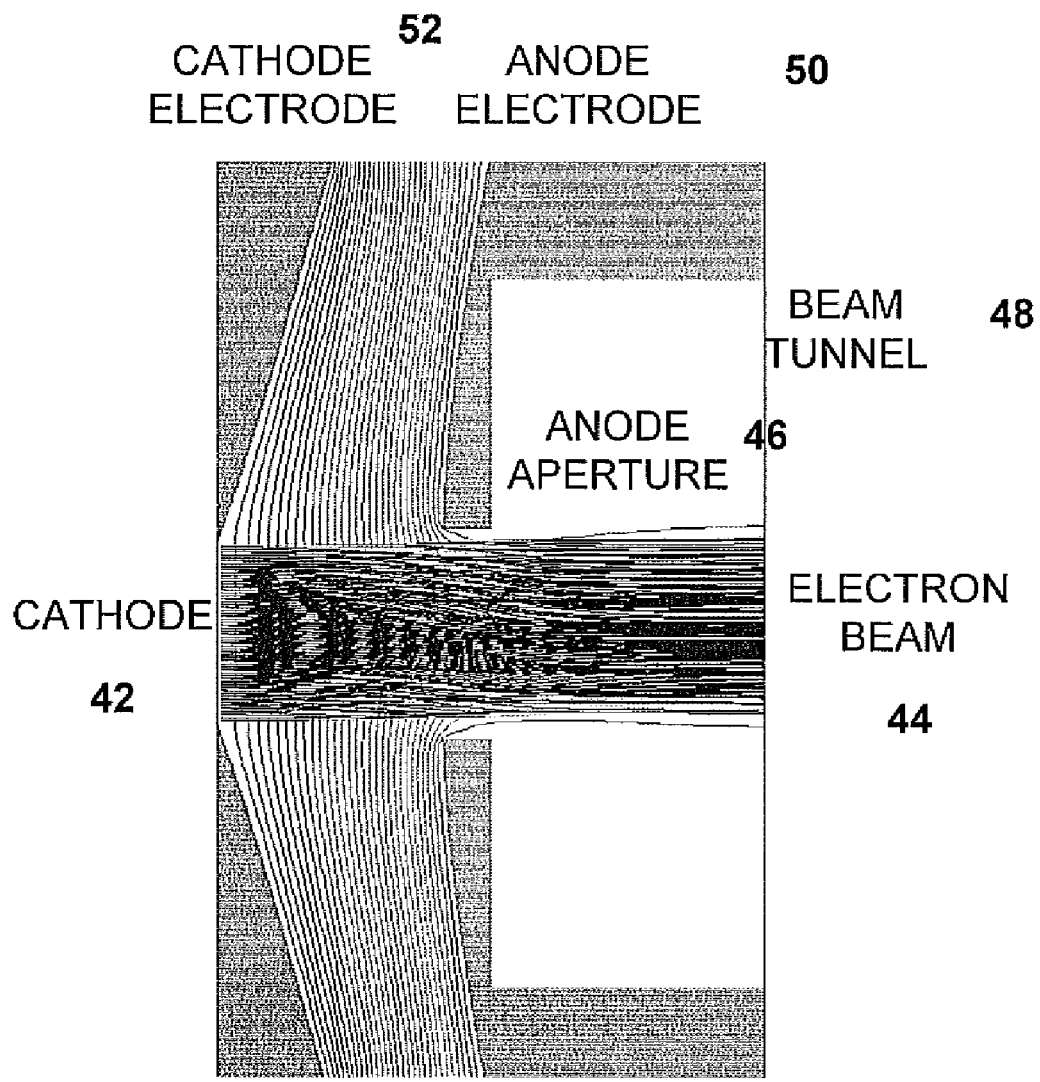
FIG. 5 is an Omnitrak simulation illustrating a circular beam being force balance matched with calculated magnetic field database.

FIG. 5 shows the corresponding circular electron beam in the OMNITRAK simulation after two iterations for a circular electron beam 44 which is emitted from an emitter 42 having a cathode with a radius of 1.52 mm, a current of 0.11 ampere, a cathode-to-anode distance of 4.11 mm at radius r=1.52 mm. The diode voltage is 2300 V. In this illustrative example, the electrodes 50, 52 at the cathode and the anode are equipotential surfaces which are analytically computed to yield a Child-Langmuir flow in the absence of the circular anode aperture 46. The circular aperture 46 at the anode is chosen, and it has a radius of 1.8 mm. A larger circular beam tunnel 48 with a radius of 6.0 mm is connected to the anode. The total length of the system is 10 mm.

Figure 6:
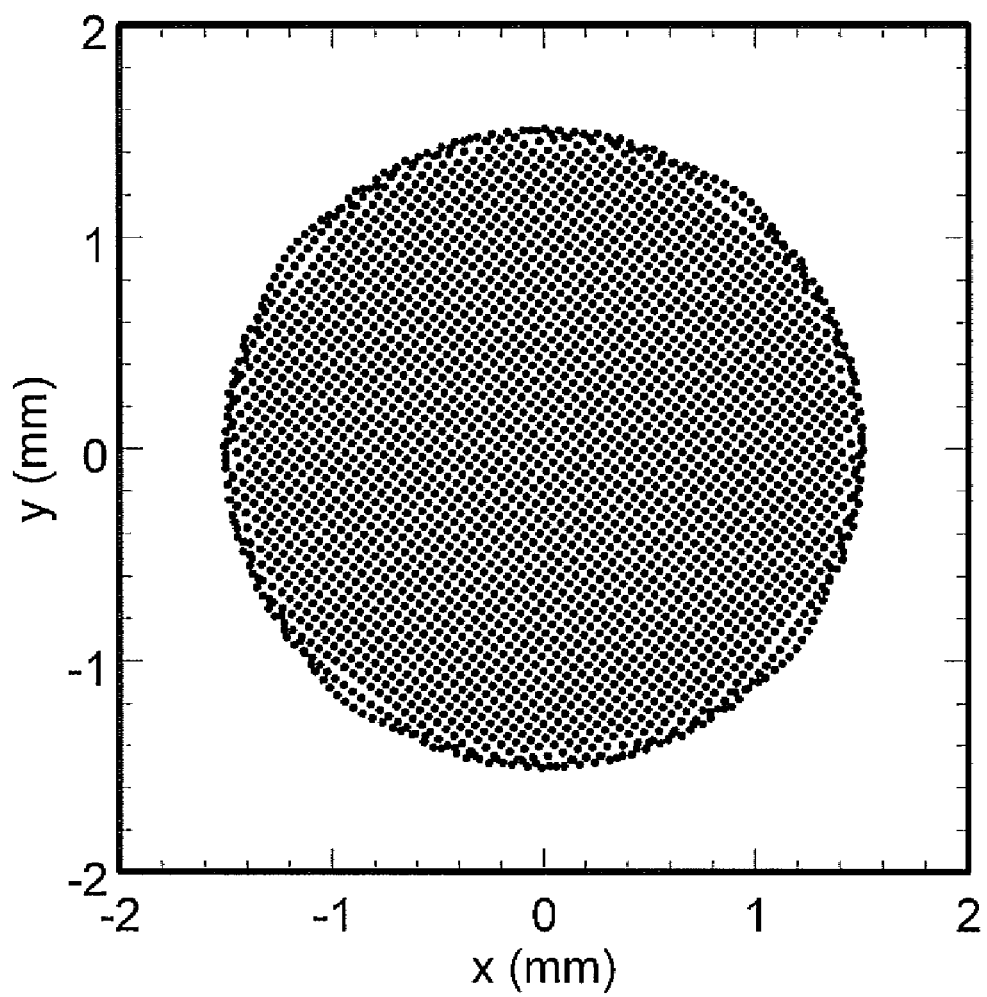
FIG. 6 is a graph illustrating electron trajectories as they intersect the plane at z=8.0 mm.

FIG. 6 shows the electron trajectories as they intersect the plane at z=8.0 mm. Detailed analyses of the simulation results show that the outer beam radius remains to be the same as the cathode radius within 1% to 3%, and that the beam density remains to be uniform in the beam core. Indeed, the normalized fourth moment $\langle r^4\rangle/\langle r^2\rangle^2$ which is equal to 4/3 for a transversely uniform density distribution, remains 4/3 within ±1%. The normalized angular rotation velocity is $\omega_b = \langle x'y\rangle/\langle y^2\rangle = -0.0244$ rad/mm, and the unnormalized rms thermal emittances in the x- and y-directions are $\epsilon_x^{th} \equiv \sqrt{\langle x^2\rangle\langle(x'-\omega_b y)^2\rangle} = 1.96$ mm-mrad and $\epsilon_y^{th} \equiv \sqrt{\langle y^2\rangle\langle(y'-\omega_b x)^2\rangle} = 1.96$, respectively, which correspond to a normalized rms thermal emittance of $\epsilon_n^{th} = \gamma_b \beta_b \epsilon_x^{th} \cong \beta_b \epsilon_x^{th} = 0.186$ mm-mrad. Adding this (numerical) emittance to the intrinsic normalized rms emittance of 0.33 mm-mrad for a thermionic cathode of radius 1.52 mm predicts a normalized thermal emittance of $\epsilon_n^{actual} \leq (0.186^2 + 0.33^2)^{1/2} = 0.38$ mm-mrad for the actual electron beam.

Because the beam is in laminar flow, a depressed collector is designed using the same geometry as the beam-generation diode, where the circular emitting disk is the beam collecting surface, and diode voltage is slightly lower, for example, a fraction of a percent lower, than the diode voltage but has a negative bias. Such a depressed collector has a collection efficiency of nearly 100%.

Although the present invention has been shown and described with respect to several preferred embodiments thereof, various changes, omissions and additions to the form and detail thereof, may be made therein, without departing from the spirit and scope of the invention.

What is claimed is:

1. A high-brightness, space-charge-dominated circular charged-particle beam system, comprising
   a flat circular emitter that emits charge particles to form a space-charge-dominated circular charged-particle beam, said space-charge-dominated circular charged-particle beam is emitted from the flat circular emitter with a uniform density and having a current emission being space-charge-limited, obeying the Child-Langmuir law;
   a diode comprising at least one electrode at the flat circular emitter and at least one additional electrode that accelerates the charged particles;
   a beam tunnel that is coupled electrically to at least one of the additional electrodes;
   an applied axisymmetric magnetic field for focusing said space-charge-dominated circular charged-particle beam; and
   a depressed collector which collects the space-charge-dominated circular charged-particle beam.

2. The high-brightness, space-charge-dominated circular charged-particle beam system of claim 1, wherein said charge particles comprise electrons, positrons, protons, and antiprotons, or ions.

3. The high-brightness, space-charge-dominated circular charged-particle beam system of claim 1, wherein said flat circular emitter comprises a cathode with a radius in the range of 0.015 mm to 15 cm.

4. The high-brightness, space-charge-dominated circular charged-particle beam system of claim 1, wherein said applied axisymmetric magnetic field is produced using a plurality of magnets.

5. The high-brightness, space-charge-dominated circular charged-particle beam system of claim 1, wherein said at least one electrode and said at least additional one electrode are equipotential surfaces.

6. The high-brightness, space-charge-dominated circular charged-particle beam system of claim 1, wherein said at least one electrode, said at least additional one electrode, and said applied axisymmetric magnetic field are designed to preserve the beam cross section of said space-charge-dominated circular charged-particle beam in the acceleration section.

7. The high-brightness, space-charge-dominated circular charged-particle beam system of claim 1, wherein said depressed collector is designed using the same geometry as the diode.

8. The high-brightness, space-charge-dominated circular charged-particle beam system of claim 1, wherein said diode voltage comprises a voltage greater than 10 V.

9. The high-brightness, space-charge-dominated circular charged-particle beam system of claim 1, wherein space-charge-dominated circular charged-particle beam comprises a laminar flow.

10. A method of forming a high-brightness space-charge-dominated circular charged-particle beam system, comprising
    forming a flat circular emitter that emits charge particles to form a space-charge-dominated circular charged-particle beam, said space-charge-dominated circular charged-particle beam is emitted from the flat circular emitter with a uniform density and having a current emission being space-charge-limited, obeying the Child-Langmuir law;
    forming a diode comprising at least one electrode at the flat circular emitter and at least one additional electrode that accelerates the charged particles;
    forming a beam tunnel that is coupled electrically to at least one of the additional electrode;
    forming an applied axisymmetric magnetic field for focusing said space-charge-dominated circular charged-particle beam; and
    forming a depressed collector which collects the space-charge-dominated circular charged-particle beam.

11. The method of claim 10, wherein said charge particles comprise electrons, positrons, protons, and antiprotons, or ions.

12. The method of claim 10, wherein said flat circular emitter comprises a cathode with a radius in the range of 0.02 mm to 20 cm.

13. The method of claim 10, wherein said applied axisymmetric magnetic field is produced using a plurality of magnets.

14. The method of claim 10, wherein said at least one electrode and said at least additional one electrode are equipotential surfaces.

15. The method system of claim 10, wherein said at least one electrode, said at least additional one electrode, and said applied axisymmetric magnetic field are designed to preserve the beam cross section of said space-charge-dominated circular charged-particle beam.

16. The method of claim 10, wherein said depressed collector is designed using the same geometry as the diode.

17. The method of claim 10, wherein said diode voltage comprises a voltage greater than 10 V.

18. The method of claim 10, wherein space-charge-dominated circular charged-particle beam comprises a laminar flow.

* * * * *